United States Patent [19]
Takayanagi et al.

[11] Patent Number: 5,270,573
[45] Date of Patent: Dec. 14, 1993

[54] RESIN MOLD FIELD EFFECT SEMICONDUCTOR DEVICE

[75] Inventors: Kanesige Takayanagi; Takashi Ono, both of Fukuoka, Japan

[73] Assignee: Mitsubishi Denki Kabushiki Kaisha, Tokyo, Japan

[21] Appl. No.: 814,478

[22] Filed: Dec. 30, 1991

[30] Foreign Application Priority Data

Feb. 18, 1991 [JP] Japan .................................. 3-023074

[51] Int. Cl.$^5$ ...................... H01L 23/28; H01L 23/06
[52] U.S. Cl. ..................................... 257/787; 257/789
[58] Field of Search ............... 257/787, 789, 795, 633, 257/632, 634, 249

[56] References Cited

U.S. PATENT DOCUMENTS 4,744,637  5/1988  Sekimura et al. ...................... 359/68
5,070,041  12/1991  Katayama et al. .................. 257/702

FOREIGN PATENT DOCUMENTS 60-167451  8/1985  Japan .

Primary Examiner—Rolf Hille
Assistant Examiner—S. V. Clark
Attorney, Agent, or Firm—Oblon, Spivak, McClelland, Maier & Neustadt

[57] ABSTRACT

A semiconductor element includes a vertical power MOSFET whose base material is silicon crystal having (100) plane as a major face. The semiconductor element is brazed to the surface of a metal plate with a brazing filler metal. By means of a transfer molding technology, the semiconductor element, the metal plate, inner lead wires and parts of external terminals are sealed in a resin having a linear expansion coefficient 1.2 times larger than that of the metal plate.

The ON resistance of the field effect transistor can be decreased by 10% or more, and the exothermic reaction of a semiconductor device itself is restrained.

7 Claims, 5 Drawing Sheets

RESIN MOLD FIELD EFFECT SEMICONDUCTOR DEVICE

BACKGROUND OF THE INVENTION

1. Field of the Invention

The present invention relates to a semiconductor device in which a field effect semiconductor element is formed in a resin mold package and a method of making the same.

2. Description of the Background Art

FIG. 6(a) is a perspective view schematically showing the appearance of a conventional resin mold field effect semiconductor device $SD_p$ (simply referred to as a "semiconductor device" hereinafter). FIG. 6(b) is a perspective view schematically showing the internal structure of the semiconductor device $SD_p$ of FIG. 6(a).

The semiconductor device $SD_p$ includes a semiconductor element 10, in which a power MOS field effect transistor (hereinafter referred to as a "power MOSFET") whose major face is the (111) plane of silicon single crystal is formed. The semiconductor element 10 (a power MOSFET chip) is fixed to the surface of a metal plate 3 made of Cu and the like with a brazing filler metal 2.

An extraction electrode layer not shown is provided on the top face of the semiconductor element 10, and is connected to external terminals 5 through inner lead wires 4 joined therewith by wire bonding. There is formed a passivation film 6 such as varnish on the surface of the semiconductor element 10. After the structure shown in FIG. 6(b) is formed, the semiconductor element 10 and the metal plate 3 are sealed in a resin 70 such as an epoxy resin by means of a transfer molding technology. Finally formed is the semiconductor device $SD_p$ in the shape shown in FIG. 6(a).

In the conventional semiconductor device $SD_p$, the resin 70 having a linear expansion coefficient approximate to that of the semiconductor element 10 is selectively used. For instance, such a resin is obtained by adding appropriate filler material to the epoxy resin and the like. The purpose of this addition is to relax the thermal stress generated in the interface between the resin 70 and the semiconductor element 1 resulting from change in an environmental temperature in using the semiconductor device $SD_p$ or from temperature rise by the exothermic reaction of the semiconductor element 10 itself. This enables the prevention of the generation of cracks and chip fractures in the semiconductor element 10.

For a large current flow in the semiconductor device $SD_p$ of the present invention in which the semiconductor element 10 is used as the power MOSFET, it is preferable that a drain-source ON resistance $R_{on}$ (simply referred to as an "ON resistance" hereinafter) is as small as possible. However, the ON resistance $R_{on}$ is relatively large (about 1 106 at 25° C.) in the conventional structure mentioned above.

Thus the achievement of a semiconductor device has been desired, in which the ON resistance $R_{on}$ is smaller than the conventional one while relaxing the thermal stress applied to the semiconductor element 10 to prevent the chip cracks.

SUMMARY OF THE INVENTION

According to the present invention, a resin mold field effect semiconductor device comprises a field effect semiconductor element having (100) plane of silicon single crystal as a major face, a metal plate to which the semiconductor element is fixed, and a resin for covering the semiconductor element and the metal plate, the linear expansion coefficient of the resin being larger than that of the metal plate.

The present invention is also intended for a method of making a resin mold field effect semiconductor device. The method comprises the steps of fixing to a metal plate a field effect semiconductor element having (100) plane of silicon single crystal as a major face, covering the semiconductor element and the metal plate with a fluid resin at a relatively high first temperature, the linear expansion coefficient of the resin being 1.2 times larger than that of the metal plate, and cooling the resin with the semiconductor element and the metal plate to a relatively low second temperature to harden the resin.

The linear expansion coefficient of the resin of the present invention is larger than that of the metal plate. After the molding by means of the transfer molding technology, the resin shrinks more than the metal plate, so that relatively large compressive stress is applied to the semiconductor element. The compressive stress enables the ON resistance of the semiconductor element to decrease.

Since the (100) plane of the silicon single crystal is used as the major face, the proof stress against the compressive stress is large, so that chip cracks are prevented.

The method of the present invention provides the above-mentioned semiconductor device. The desirable linear expansion coefficient of the resin is specified in relation to the linear expansion coefficient of the metal plate.

According to the present invention, the silicon single crystal whose major face is the (100) plane is used as the field effect semiconductor element. The relation between the linear expansion coefficients of the metal plate and sealing resin is specified such that the compressive stress is applied to the semiconductor device. This enables the ON resistance of the field effect semiconductor element to decrease. Therefore, the exothermic reaction of the semiconductor device itself is restrained. A large current flow is permitted in the semiconductor device.

The above-mentioned semiconductor device can be made by the method of the present invention.

An object of the present invention is to provide a semiconductor device capable of reducing the occurrences of chip cracks in a semiconductor element, decreasing an ON resistance to restrain an exothermic reaction and flowing a large current, and a method of making the same.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
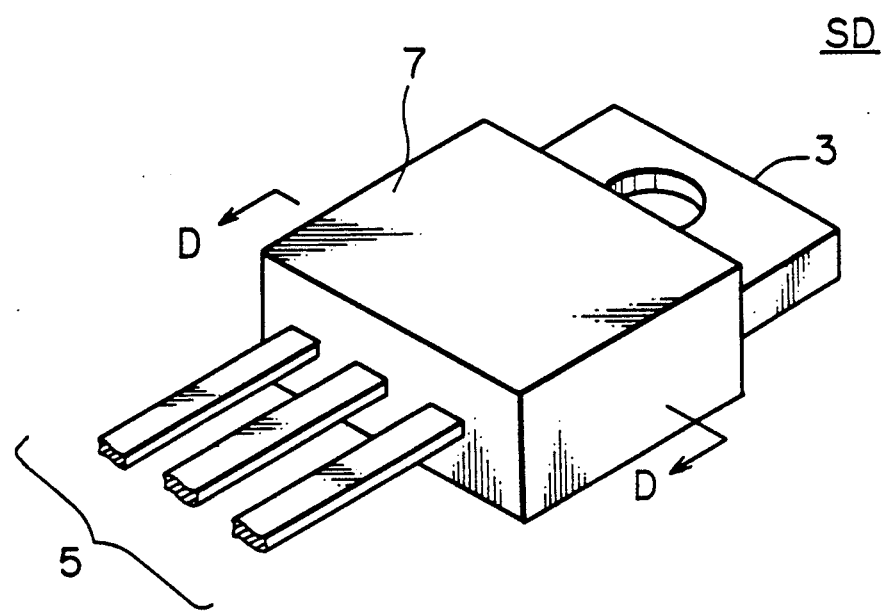
FIGS. 1(a) and 1(b) schematically illustrate the appearance and inner structure of a semiconductor device according to a preferred embodiment of the present invention, respectively.
Figure 1B:
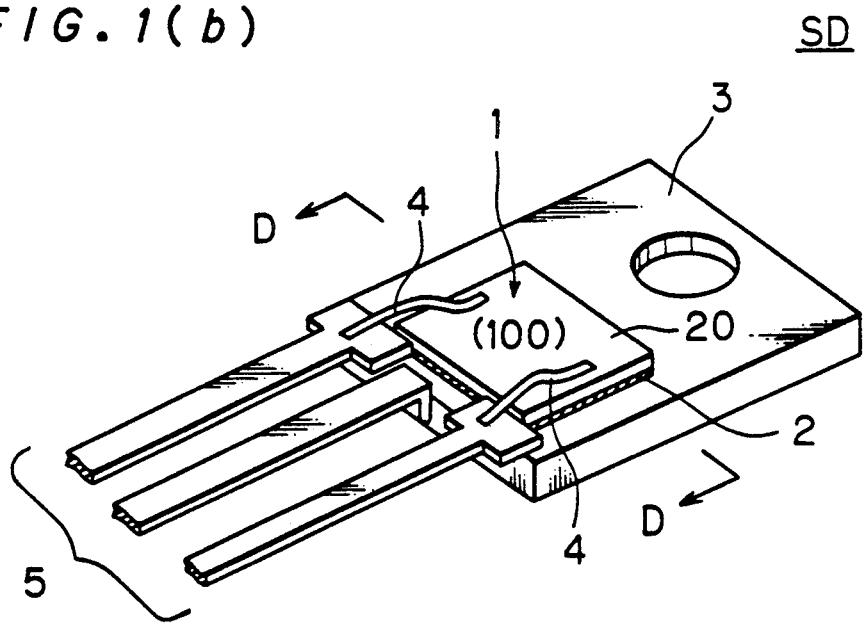
Figure 2:
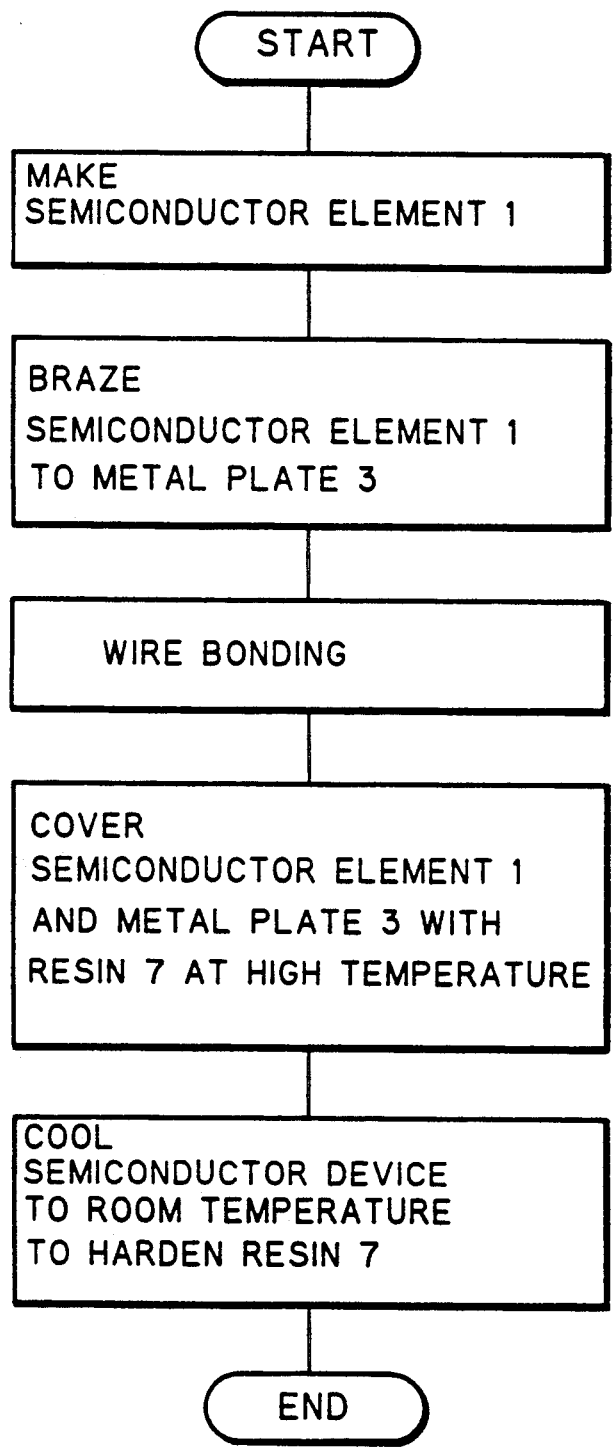
FIG. 2 is a flow chart of the major steps of making the semiconductor device of FIGS. 1(a) and 1(b)

FIG. 1(a) is a perspective view schematically showing the appearance of a semiconductor device SD according to a preferred embodiment of the present invention, and FIG. 1(b) is a perspective view schematically showing the inner structure of the semiconductor device SD of FIG. 1(a). FIG. 2 is a flow chart of the major steps of making the semiconductor device SD. Hereinafter discussed is the structure of the semiconductor device SD in accordance with the steps.

The semiconductor device SD includes a semiconductor element 1. A vertical power MOSFET whose major face is the <100> azimuth plane, i.e., the (100) plane of silicon single crystal is formed in the semiconductor element 1. The initial step of making the semiconductor element 1 is to prepare a silicon wafer having the (100) plane as a major face. The vertical power MOSFET is formed through the step of doping the silicon wafer and otherwise steps.

Next, the semiconductor element 1 is fixed to the surface of a metal plate 3 made of Cu and the like with a brazing filler metal 2 such that the (100) plane of the silicon single crystal constituting the semiconductor element 1 is approximately parallel to the top face of the metal plate 3. In general, the metal plate 3 in various shapes is employable. A metal plate the end of which is partially used as an external terminal may be employed. The brazing filler metal 2 may be solders, conductive adhesives and the like.

Figure 6A:
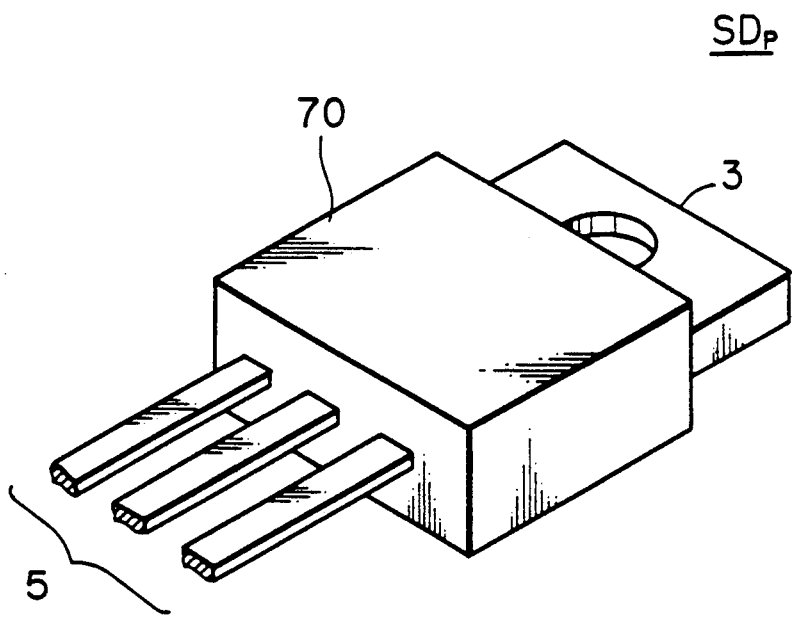
FIGS. 6(a) and 6(b) schematically illustrate the appearance and inner structure of a conventional resin mold field effect semiconductor device, respectively.
Figure 6B:
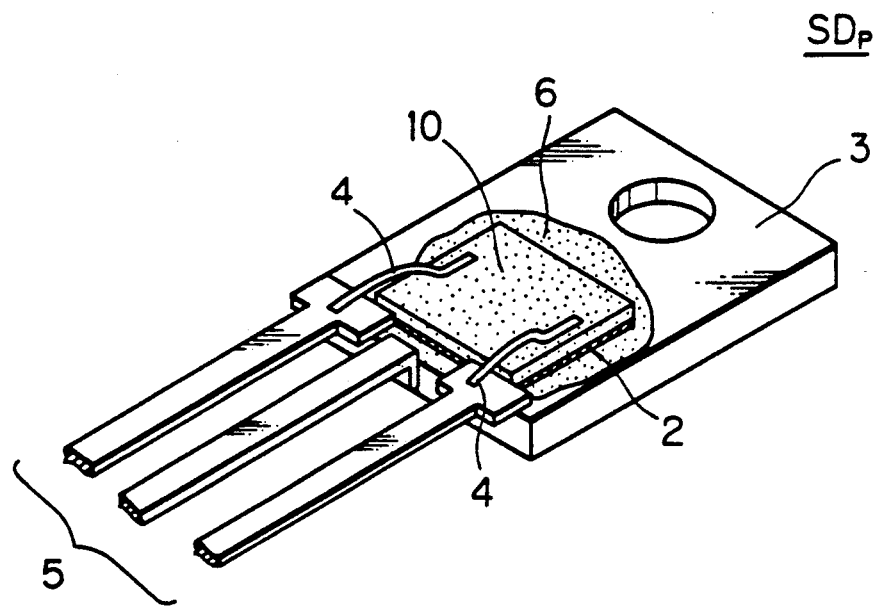

An extraction electrode layer (not shown) provided on the top face of the semiconductor element 1 is connected to external terminals 5 through inner lead wires 4 joined therewith by wire bonding. Unlike the semiconductor element 10 shown in FIGS. 6(a) and 6(b), a passivation film such as varnish is not formed on the surface of the semiconductor element 1 of the preferred embodiment.

The structure thus obtained is introduced into a transfer molding device, in which a fluid resin is provided around the semiconductor element 1 and metal plate 3 at a first temperature selected in the range of 160° to 180° C. The property required for the resin will be described later.

After the semiconductor device SD is cooled to a temperature below the hardening temperature (glass-transition temperature) of the resin, the semiconductor device SD is taken out of a sealing metal mold (not shown). The resin with the semiconductor element 1 and metal plate 3 is further cooled to room temperature (a second temperature, e.g., 25° C.). The semiconductor device SD is thus accomplished. A resin 7 thus molded is illustrated in FIG. 1(a).

The property required for the resin 7 is that its linear expansion coefficient $a_{re}$ is larger than the linear expansion coefficient $a_m$ of the metal plate 3. It is preferable that the linear expansion coefficient of the resin is 1.2 times larger than the linear expansion coefficient $a_m$ of the metal plate 3. For example, a resin commercially obtainable from SUMITOMO BAKELITE CO., LTD., Japan, under the trade mark of "EME5000" is employable as the resin 7. In practice, the linear expansion coefficient $a_{Si}$ of silicon is about $2.9 \times 10^{-6}/°$ C., the linear expansion coefficient $a_m$ of the metal plate 3 (Cu) is about $17.2 \times 10^{-6}/°$ C., the linear expansion coefficient $a_{re}$ of the resin 7 (EME5000) is about $26.7 \times 10^{-6}/°$ C., and the linear expansion coefficient $a^*_{re}$ of the prior art resin 70 is about $20.2 \times 10^{-6}/°$ C.

Therefore, the following formula holds:

$$a_{re} > 1.2 a_m > a^*_{re} > a_{Si} \qquad (1).$$

Figure 3:
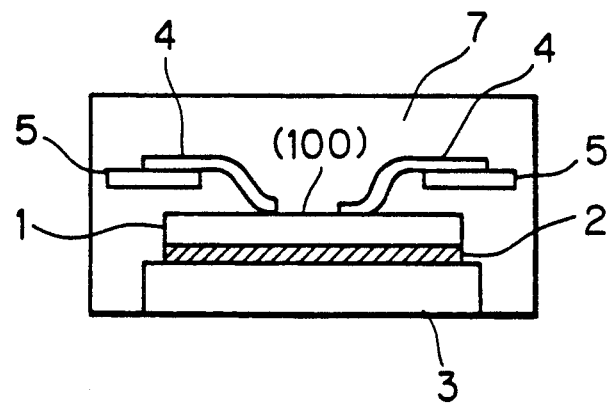
FIG. 3 is a cross-sectional view of the semiconductor device in a transfer molding process.

Hereinafter described is the property of the semiconductor device SD made by the aforesaid process. FIG. 3 is a cross-sectional view schematically showing respective components of the semiconductor device SD where the resin 7 is fluid at the first temperature in the transfer molding device, and corresponds to the cross section taken along the line D—D of FIGS. 1(a) and 1(b). Both the resin 7 and the metal plate 3 are thermally expanded substantially at thermal equilibrium.

Figure 4:
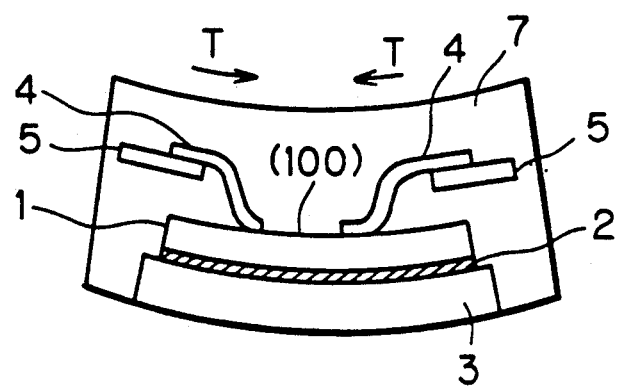
FIG. 4 is a cross-sectional view of the semiconductor device at room temperature.

FIG. 4 schematically illustrates the respective components of the semiconductor device SD which has been sealed in the resin and has been cooled to room temperature. Since the resin 7 tends to shrink more than the metal plate 3 because of the difference in linear expansion coefficients, the semiconductor element 1, the brazing filler metal 2, the metal plate 3 and the resin 7 are strained into downwardly convex form. Compressive stress T is applied to the semiconductor element 1, so that the strain is generated within the semiconductor element 1. This results in the change of the electrical resistivity of the semiconductor element 1 by piezoresistance effect.

In the semiconductor device SD of the preferred embodiment, the silicon single crystal having the main face of the (100) plane (hereinafter referred to as "(100) Si single crystal) is used as the base material of the semiconductor element 1. A drain-source ON resistance $R_{on}$ can be decreased, compared with the semiconductor device which uses the silicon single crystal having the main face of the (111) plane (hereinafter referred to as "(111) Si single crystal), as described later. In addition, since the (100) Si single crystal has a large proof stress against the compressive stress T, less chip cracks occur when the compressive stress T is applied to the semiconductor element 1.

Figure 5:
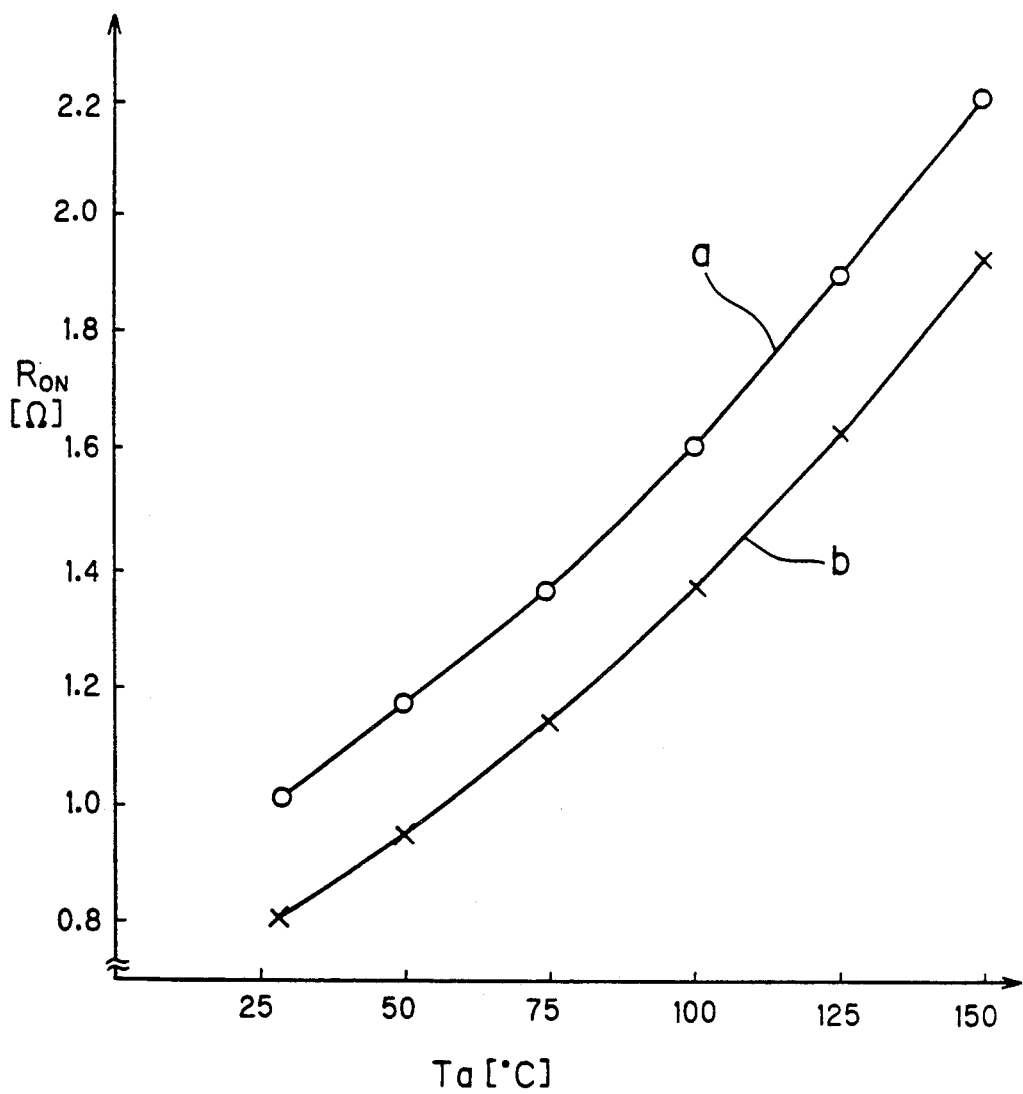
FIG. 5 is a graph showing experimental results for the temperature dependence of an ON resistance $R_{on}$ of the semiconductor device.

FIG. 5 is a graph showing the experimental results for the temperature dependence of the ON resistance $R_{on}$ of the semiconductor device where the base material of the semiconductor element 1 is the (111) Si single crystal and the (100) Si single crystal. In FIG. 5, the curve a shows the result of the (111) Si single crystal (where the open circles indicate experimental values). The curve b shows the result of the (100) Si single crystal (where the crosses indicate experimental values). The abscissa of the graph is an ambient temperature Ta of the semiconductor device. The ambient temperature Ta of 150° C. corresponds to the first temperature in the transfer molding process. The ordinate of the graph is the ON resistance $R_{on}$.

As is apparent from FIG. 5, the ON resistance $R_{on}$ decreases as the ambient temperature Ta decreases. Within the range of objective temperatures, the ON resistance where the (100) Si single crystal is used is smaller than that where the (111) Si single crystal is used. At 25° C., for example, the former is about 0.88Ω while the latter is about 1Ω. The use of the (100) Si single crystal decreases the ON resistance by about 12% compared with the (111) Si single crystal.

Now compared is the change rate of the ON resistance $R_{on}$ relative to the change in ambient temperature Ta (the ratio of the ON resistance $R_{on}$ when Ta=150° C. to the ON resistance when Ta=25° C.). The change rate of the ON resistance $R_{on}$ where the (111) Si single crystal is used is about 2.2, while that of the ON resistance $R_{on}$ where the (100) Si single crystal is used is about 2.4. It is found that the latter is larger than the former. Therefore, when the base material of the semiconductor element 1 is the (100) Si single crystal, the piezoresistance effect is larger and is utilized more effectively.

As described hereinabove, to decrease the ON resistance $R_{on}$ of the semiconductor element 1 by the piezoresistance effect, it is effective to selectively use the resin having the linear expansion coefficient larger than that of the metal plate as the sealing resin 7 and the (100) Si single crystal as the base material of the semiconductor element 1. It has been also confirmed by experiments that only the removal of the passivation film 6 such as varnish of the prior art can decrease the ON resistance $R_{on}$. The combination of the removal with the structure of the present invention will enables the ON resistance $R_{on}$ to decrease furthermore.

In general, the linear expansion coefficient of the resin often changes before and after the hardening (glass transition). The "linear expansion coefficient" of the resin in the present invention in such a case is defined as the average value of the respective linear expansion coefficients before and after the hardening in the range of the changing temperatures.

While the invention has been shown and described in detail, the foregoing description is in all aspects illustrative and not restrictive. It is therefore understood that numerous modifications and variations can be devised without departing from the scope of the invention.

We claim:

1. A field effect semiconductor device comprising:
   (a) a field effect semiconductor element having (100) plane of silicon single crystal as a major face;
   (b) metal plate to which said semiconductor element is fixed; and
   (c) a resin for covering said semiconductor element and said metal plate, the linear expansion coefficient of said resin being larger than the linear expansion coefficient of said metal plate.

2. The field effect semiconductor device of claim 1, wherein
   the linear expansion coefficient of said resin is 1.2 times larger than the linear expansion coefficient of said metal plate.

3. The field effect semiconductor device of claim 2, wherein
   said metal plate is substantially made of Cu;
   the linear expansion coefficient of said metal plate is about $17.2 \times 10^{-6}/°C.$; and
   the linear expansion coefficient of said resin is about $26.7 \times 10^{-6}/°C.$ 4. The field effect semiconductor device of claim 3, wherein
   said field effect semiconductor element includes:
   (a-1) a vertical power MOS field effect transistor.

5. The field effect semiconductor device of claim 4, further comprising:
   (d) a brazing metal layer provided between said field effect semiconductor element and said metal plate to fix said field effect semiconductor element to said metal plate.

6. The field effect semiconductor device of claim 5, further comprising:
   (e) a terminal member having:
   (e-1) a first portion buried in said resin and electrically connected to said field effect semiconductor element; and
   (e-2) a second portion extending from said first potion to exterior of said resin.

7. The field effect semiconductor device of claim 6, further comprising:
   (f) a wire buried in said resin and electrically connecting said first portion of said terminal member to said field effect semiconductor element.

* * * * *